United States Patent Office
2,953,438
Patented Sept. 20, 1960

2,953,438

HEAT TREATMENT OF SILICON

Brian Dale, Amersham, England, assignor to The General Electric Company Limited, London, England No Drawing. Filed Dec. 3, 1958, Ser. No. 777,851
Claims priority, application Great Britain Jan. 30, 1958
4 Claims. (Cl. 23—223.5)

This invention relates to the heat treatment of silicon.

Silicon as currently prepared for use in semi-conductor devices such as rectifiers and transistors commonly has a minority carrier lifetime greater than one microsecond. For certain applications, for example the manufacture of rectifiers which exhibit relatively small minority carrier storage effects and are therefore suitable for use in high speed switching circuits, such a value of the minority carrier lifetime may be undesirably high.

It is therefore an object of the present invention to provide a method of heat treating silicon having a minority carrier lifetime greater than one microsecond, which method results in a considerable reduction of this lifetime.

According to the invention, a method of heat treating silicon having a minority carrier lifetime greater than one microsecond consists in carrying out at least once the steps of heating the silicon to a temperature greater than 1100° C. but below its melting point, and then cooling the silicon to a temperature below 800° C. in such a manner that the silicon traverses the temperature range between 1100° C. and 800° C. in less than 0.3 second.

One method of heat treating silicon in accordance with the invention will now be described by way of example.

In this method the silicon is of N-type conductivity, has a resistivity in the range 3–3.5 ohm centimetres, and has a hole lifetime of the order of 10 microseconds; the silicon is in the form of wafers cut from a single crystal, each wafer having main faces one millimetre square and having a thickness of 0.2 millimetre. In the heat treatment, use is made of an electric resistance heater in the form of a strip of molybdenum having a length of three centimetres, a width of 7.5 millimetres, and a thickness of 0.025 millimetre; the heater is mounted with its main faces horizontal and is provided at its ends with terminals which are connectible via a switch to a current source adapted to pass a current of about 50 amperes through the heater. During the heat treatment a number of the silicon wafers are disposed on the heater, which is maintained in an atmosphere of nitrogen throughout the heat treatment. The heat treatment consists of three heating and cooling cycles which are brought about by switching on the heater current for three periods of four seconds separated by intervals of four seconds. The passage of the current through the heater on each occasion raises the temperature of the wafers to about 1150° C., and each time the current is switched off the heater and wafers cool very rapidly, dropping to a temperature below 700° C. in less than 0.2 second.

The result of this heat treatment is a very great reduction in the hole lifetime of the silicon, and in fact this reduction is so great that the resultant lifetime is not directly measurable by currently available techniques. The reduction of the hole lifetime brought about by the method described may, however, be illustrated by measurements of the hole storage effect in P–N junction rectifiers respectively manufactured from wafers treated by the method and from otherwise similar wafers which have not been heat treated.

These rectifiers are produced by alloying to opposite main faces of a wafer the ends of wires which are respectively of aluminum and a gold-antimony alloy, and then encapsulating the resultant assembly in a suitable envelope; for example, the rectifiers may be produced in the manner described in the specification of co-pending patent application No. 754,675, for Methods of Forming P–N Junctions in Semiconductors, filed August 12, 1958, by Emrys G. James, James S. Miller and John Reeves, and assigned to the assignee of the present application. The alloying of the aluminium wire to the silicon produces a region of P-type silicon which is separated from the basic N-type silicon by a P–N junction, and the aluminium and gold-antimony wires respectively serve as connectors for the P-type and N-type silicon.

A suitable method of measuring the hole storage effect in such rectifiers is as follows. The rectifier is initially biased so that a current of predetermined value flows in the forward direction, and a reverse bias of predetermined value is then applied to the rectifier. Upon the application of the reverse bias a transient current flows through the rectifier in the reverse direction, this current having a peak value which is considerably larger than the normal reverse current of the rectifier for the relevant bias and being due to the diffusion back to the P–N junction of holes which were injected into the N-type silicon across the P–N junction when current was flowing in the forward direction. (It should be noted that since the electrical conductivity of the P-type region produced by the alloying is very much higher than that of the N-type region, the effect of electron storage in the P-type region is negligible.) Thus, measurement of the total charge flowing in the reverse direction during the occurrence of the transient current will give a measure of the hole storage effect in the rectifier, and it is believed that the value of this charge is approximately proportional to the hole lifetime in the N-type silicon.

Measurements made in this manner on one particular type of rectifier produced from silicon wafers as described above gave the following results in the case where the rectifiers were initially biased so as to pass a current of 10 milliamperes in the forward direction and were then suddenly switched to a reverse bias of 30 volts. For rectifiers produced from wafers which had not been heat treated the values of the total charge flowing in the reverse direction lay in the range $30\text{–}70 \times 10^{-10}$ coulombs, with a mean value of $45 \times 10^{-10}$ coulombs, while for rectifiers produced from wafers which had been heat treated by the method described above the values of the charge lay in the range $0.1\text{–}2.5 \times 10^{-10}$ coulombs, with a mean value of $0.8 \times 10^{-10}$ coulombs.

Similar measurements made upon rectifiers produced from wafers which had been heat treated by a method similar to that described above, but involving only one or two heat cycles, indicated that in the method described above the major part of the reduction of the hole lifetime is due to the first heating and cooling cycle, the second and third cycles bringing about a further useful, but proportionately much smaller, reduction of the hole lifetime.

I claim:

1. A method of heat treating silicon having a minority carrier lifetime greater than one microsecond, consisting in carrying out at least once the steps of heating the silicon to a temperature greater than 1100° C. but below its melting point, and then cooling the silicon to a temperature below 800° C. in such a manner that the silicon traverses the temperature range between 1100° C. and 800° C. in less than 0.3 second.

2. A method as set forth in claim 1 wherein the silicon that is heat treated is in the form of a wafer.

3. A method as set forth in claim 2 wherein the wafer is disposed in an inert atmosphere.

4. A method as set forth in claim 3 wherein the atmosphere constitutes nitrogen.

References Cited in the file of this patent

UNITED STATES PATENTS

| | | |
|---|---|---|
| 2,808,315 | Bemski | Oct. 1, 1957 |
| 2,817,608 | Pankove | Dec. 24, 1957 |
| 2,818,361 | Anderson et al. | Dec. 31, 1957 |